(12) United States Patent
Hill

(10) Patent No.: US 6,924,969 B2
(45) Date of Patent: Aug. 2, 2005

(54) SILICON NANOCRYSTAL CAPACITOR AND PROCESS FOR FORMING SAME

(75) Inventor: Christopher W. Hill, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/849,741

(22) Filed: May 19, 2004

(65) Prior Publication Data

US 2004/0264101 A1 Dec. 30, 2004

Related U.S. Application Data

(62) Division of application No. 10/229,445, filed on Aug. 27, 2002, now Pat. No. 6,808,983.

(51) Int. Cl.[7] .............................................. H01G 4/005
(52) U.S. Cl. ..................... 361/303; 361/305; 361/306.3; 257/68; 438/253
(58) Field of Search ................................. 361/303, 305, 361/306.3, 311–313, 330; 257/68, 71, 296–297, 306, 310

(56) References Cited

U.S. PATENT DOCUMENTS 5,801,413 A * 9/1998 Pan ............................. 257/301
6,541,807 B1 * 4/2003 Morihara ..................... 257/295
6,633,062 B2 * 10/2003 Min-Soo et al. ............ 257/310

OTHER PUBLICATIONS

"Synthese and characterization of aerosol silicon nanocrystal nonvolatile floating–gate memory device", M.L. Ostraat et al., Applied Physics Letters, vol. 79, No. 3, Jul. 16, 2001, pp. 433–435.

"Ultraclean Two–Stage Aerosol Reactor for Production of Oxide–Passivated Silicon Nanoparticles for Novel Memory Devices", Michele L. Ostraat et al., Journal of The Electrochemical Society, 148 (5), pp. G265–G270.

* cited by examiner

Primary Examiner—Anthony Dinkins
(74) Attorney, Agent, or Firm—David J. Paul

(57) ABSTRACT

A storage capacitor plate for a semiconductor assembly having a substantially continuous porous conductive storage plate comprising silicon nanocrystals residing along a surface of a conductive material and along a surface of a coplanar insulative material adjacent the conductive material, a capacitor cell dielectric overlying the silicon nanocrystals and an overlying conductive top plate. The conductive storage plate is formed by a semiconductor fabrication method comprising forming silicon nanocrystals on a surface of a conductive material and on a surface of an insulative material adjacent the conductive material, wherein silicon nanocrystals contain conductive impurities and are adjoined to form a substantially continuous porous conductive layer.

12 Claims, 4 Drawing Sheets

SILICON NANOCRYSTAL CAPACITOR AND PROCESS FOR FORMING SAME

This application is a divisional to U.S. patent application Ser. No. 10/229,445, filed Aug. 27, 2002 now U.S. Pat. No. 6,808,083.

FIELD OF THE INVENTION

This invention relates to a semiconductor device and fabrication thereof and, more particularly, to the fabrication of a silicon layer having increased surface area for use in a semiconductor device.

BACKGROUND OF THE INVENTION

Semiconductor devices, including Dynamic Random Access Memory devices (DRAMs), utilize storage capacitors to retain data. In the manufacture of DRAMs a polysilicon layer is typically used as the bottom electrode (storage plate electrode) of the cell capacitor. With the density of storage cells packed into today's DRAM devices, a storage plate electrode may require a large surface area to provide sufficient capacitance for data storage and retrieval. In order to gain surface area for the storage plate electrode the polysilicon layer may be deposited using conditions to produce a very rough film, i.e. one with a large surface area.

As evidenced by an article in *Applied Physics Letters*, Volume 79, Number 3, 16 Jul. 2001, by Ostraat et al., titled: "Synthesis and characterization of aerosol silicon nanocrystal nonvolatile floating-gate memory devices" and by an article in *Journal of The Electrochemical Society*, by Ostraat et al., 148 (5) G265–G270 (2001), titled: "Ultraclean Two-Stage Aerosol Reactor for Production of Oxide-Passivated Silicon Nanoparticles for Novel Memory Devices," an aerosol delivery method has been developed to form silicon nanocrystals. The disclosure of each of the forgoing publications is incorporated by reference.

A significant focus of the present invention comprises techniques to form a silicon nanocrystal layer having a significantly enhanced surface area for use in semiconductor devices, such as DRAMs, which will become apparent to those skilled in the art from the following disclosure.

SUMMARY OF THE INVENTION

A first exemplary implementation of the present invention includes a storage capacitor for a semiconductor assembly comprising a substantially continuous porous conductive storage plate comprising silicon nanocrystals residing along a surface of a planarized conductive material and along a surface of a planarized insulative material adjacent the conductive material, a capacitor cell dielectric and an overlying conductive top plate.

The capacitor is formed by a semiconductor fabrication method comprising forming silicon nanocrystals on a surface of a conductive material and on a surface of an insulative material adjacent the conductive material, the silicon nanocrystals contain conductive impurities and are adjoined to form a substantially continuous porous conductive layer. Next, a cell dielectric layer is formed over the silicon nanocrystals and finally, a conductive top capacitor electrode is formed over the cell dielectric layer.

A second exemplary implementation of the present invention includes a planar storage capacitor for a semiconductor assembly that is formed following the procedures of the first exemplary implementation. The second exemplary implementation demonstrates the versatile nature of the present invention.

DETAILED DESCRIPTION OF THE INVENTION

Exemplary implementations of the present invention are directed to unique capacitor structures for use in semiconductor devices and processes to fabricate same, as depicted in the embodiments of FIGS. 1–3 and 4–8.

The following exemplary implementations are in reference to capacitor structures and the fabrication thereof in a semiconductor assembly. While the concepts of the present invention are conducive to the fabrication of a storage capacitor for a Dynamic Random Access Memory (DRAM) device, the concepts taught herein may be applied to other semiconductor devices that would likewise benefit from the use of the capacitor structure and process disclosed herein. Therefore, the depictions of the present invention in reference to a DRAM storage capacitor and the manufacture thereof are not meant to so limit the extent to which one skilled in the art may apply the concepts taught hereinafter.

Figure 1:
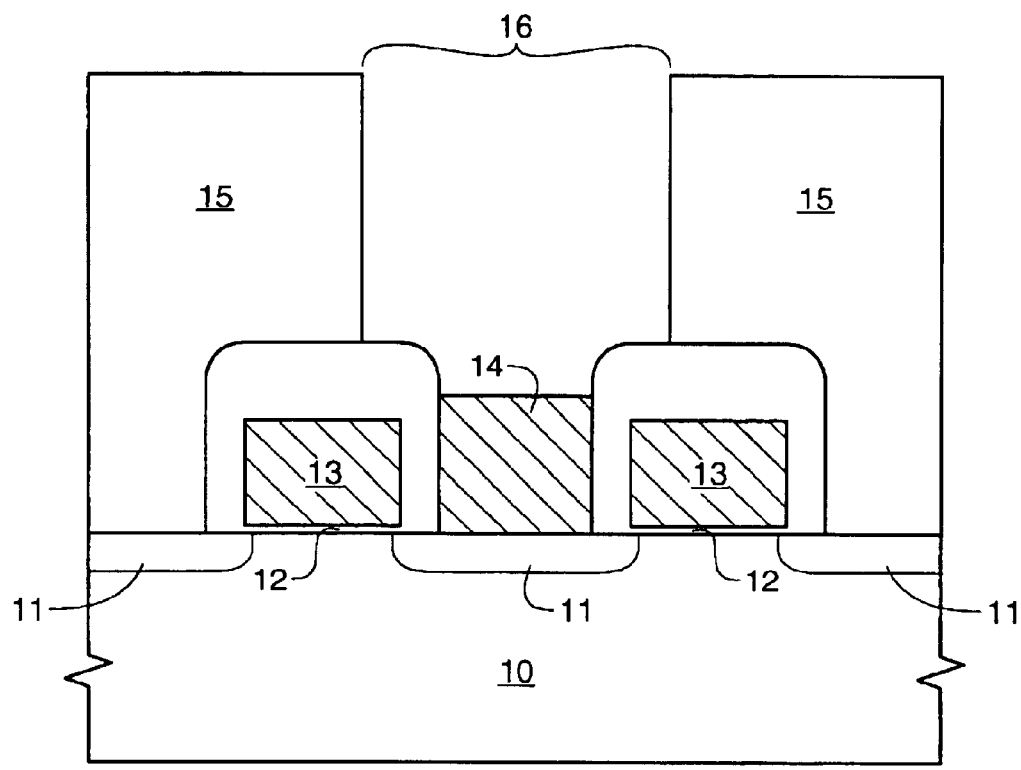
FIG. 1 is a cross-sectional view of a semiconductor substrate section showing the early stages of a memory cell after an opening has been formed into an insulative material in preparation for capacitor formation.
Figure 2:
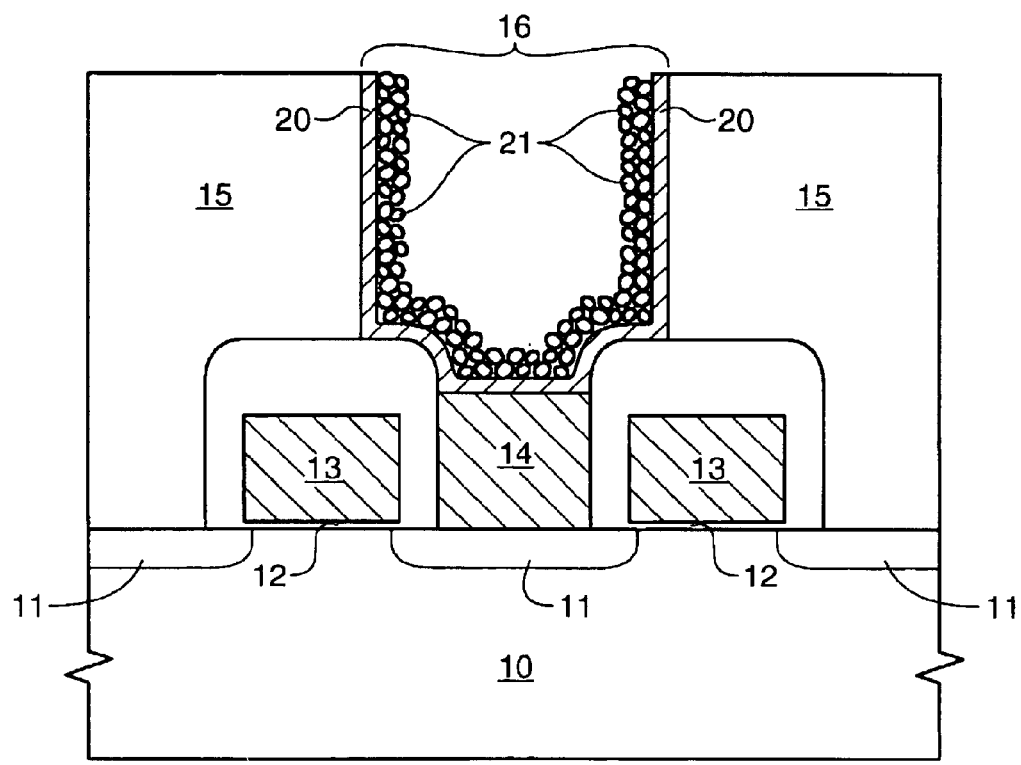
FIG. 2 is a subsequent cross-sectional view taken from FIG. 1 following the formation of an optional polysilicon liner and porous silicon nanocrystal particles.
Figure 3:
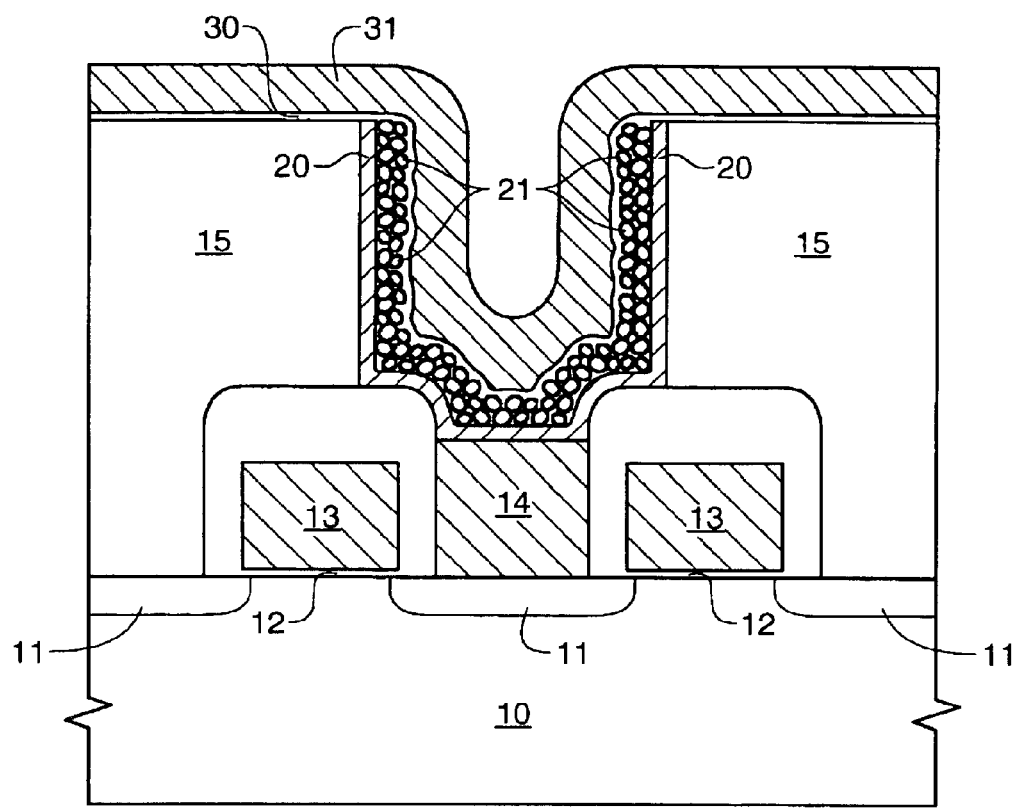
FIG. 3 is a subsequent cross-sectional view taken from FIG. 2 following the deposition of a capacitor cell dielectric and formation of a top capacitor plate.

A first exemplary implementation of the present invention is depicted in FIGS. 1–3. Referring now to FIG. 1, access transistors have been formed on substrate 10, such as a silicon substrate; by methods know to those skilled in the art. The access transistors comprise source/drain regions 11 bridged by transistor gates 13 which overlie transistor gate oxide 12. A conductive plug 14, such as a tungsten plug, has also been fabricated to so that it will make physical contact between source/drain region 11 and a subsequently formed capacitor plate (in this example a storage capacitor plate). Also shown in FIG. 1, insulative material 15 is formed, planarized and patterned to provide opening 16, which will be used to support the fabrication of a subsequently formed capacitor storage plate.

Referring now to FIG. 2, an optional polysilicon liner 20 may be formed to line the sidewalls and lower surfaces of opening 16. The presence of polysilicon liner 20 will enhance proper adhesion of subsequently formed silicon nanocrystals along the sidewalls of opening 16.

Next, whether the optional polysilicon layer 20 is present or not, silicon nanocrystals 21 are formed onto the sidewalls and lower surfaces of opening 16. Silicon nanocrystals 21, being porous in nature, form a conductive silicon film that may be further doped with conductive impurities either during deposition (in situ) or after deposition (ex situ) to increase the conductivity of the film.

It is preferred that the silicon nanocrystals cover the sidewalls of opening 16, the lower surface of opening 16 and contact conductive plug 14. However, it would also be advantageous to fill the entire opening 16 with silicon nanocrystals 21, in that the porous open structure of the silicon nanocrystals would allow increased surface area for the eventually formed capacitor storage plate.

Referring now to FIG. 3, a substantially conformal capacitor cell dielectric layer 30 is formed, preferably by Atomic Layer Deposition (ALD) technique, over the capacitor structure comprising silicon nanocrystals 21 and over the stop surface of adjoining insulative material 15. In order to benefit from additional formation of silicon nanocrystals (such as filling or at least partially filling opening 16) the more silicon nanocrystals that capacitor cell dielectric layer 30 coats the more potential capacitance that is gained.

Next, a top conductive layer is formed, preferably by ALD, on dielectric layer 30 to create a top capacitor electrode 31, or by other conventional fabrication techniques. The semiconductor device is then completed as required in accordance with conventional fabrication techniques.

Figure 4:
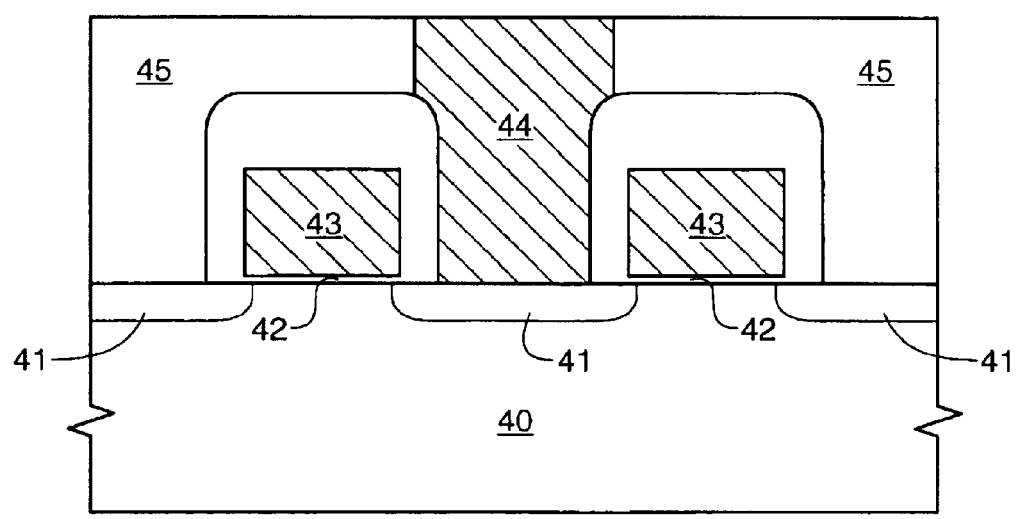
FIG. 4 is a cross-sectional view of a semiconductor substrate section showing the early stages of a memory cell after a conductive plug has been formed into a planarized insulative material in preparation for capacitor formation.

A second exemplary implementation of the present invention is depicted in FIGS. 4–8. Referring now to FIG. 4, access transistors have been formed on substrate 40, such as a silicon substrate, by methods know to those skilled in the art. The access transistors comprise source/drain regions 41 bridged by transistor gates 43 which overlie transistor gate oxide 42. A conductive plug 44, such as a tungsten plug, has also been fabricated into insulative material 45 and will make physical contact between source/drain region 41 and a subsequently formed capacitor plate (in this example a storage capacitor plate). The upper surface of the conductive plug 44 and surrounding insulative material 45 have been planarized.

Figure 5:
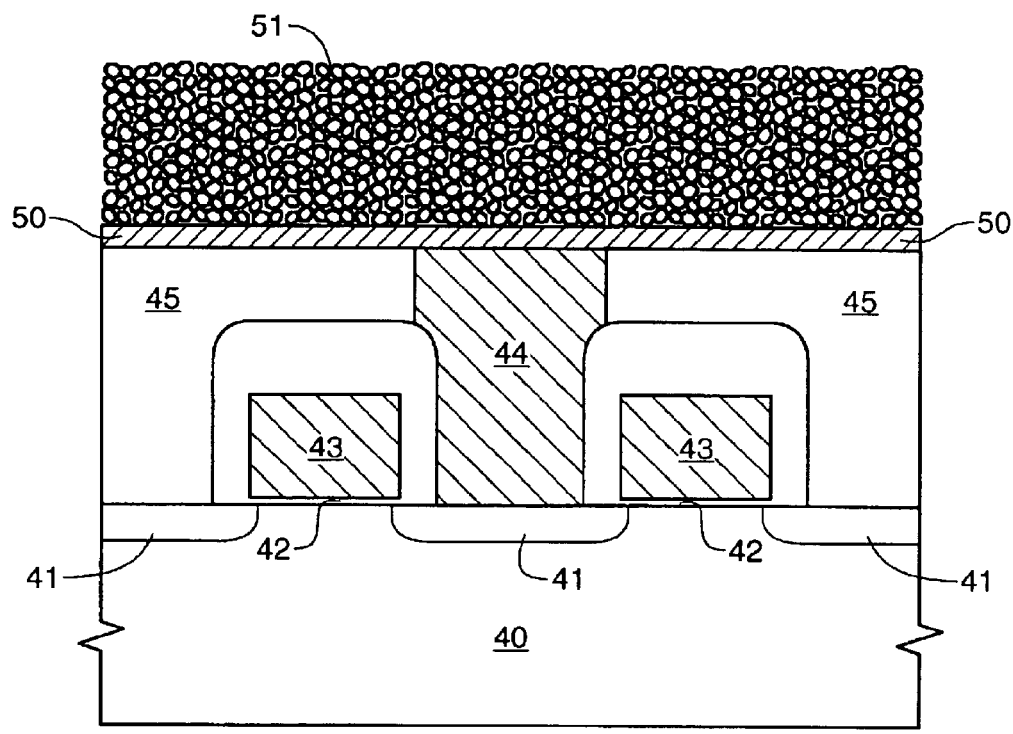
FIG. 5 is a subsequent cross-sectional view taken from FIG. 4 following the formation of an optional thin polysilicon film and porous silicon nanocrystal particles.

Referring now to FIG. 5, an optional layer of polysilicon 50 is deposited on the coplanar surfaces of insulative layer 45 and conductive plug 44. The presence of polysilicon layer 50 will enhance proper adhesion of subsequently formed silicon nanocrystals along the entire extent of the planar surfaces.

Next, whether the optional polysilicon layer 50 is present or not, silicon nanocrystals 51 are formed onto the planar surfaces. Silicon nanocrystals 51, being porous in nature, form a conductive silicon film that may be further doped with conductive impurities either during deposition (in situ) or after deposition (ex situ) to increase the conductivity of the film.

Figure 6:
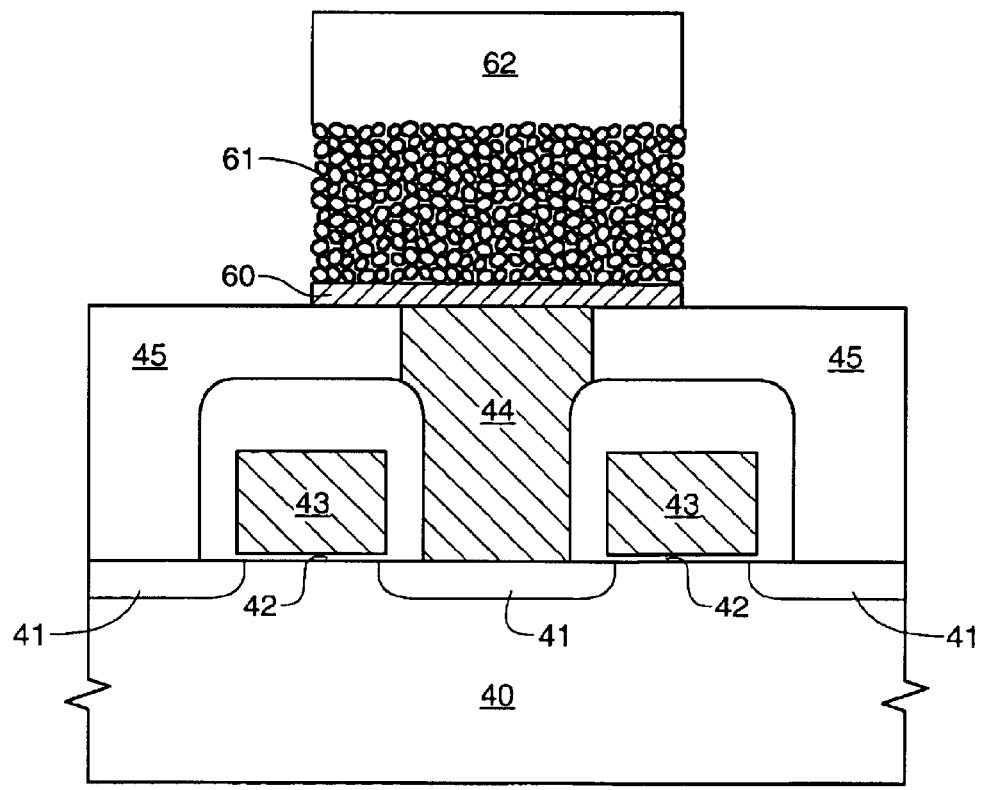
FIG. 6 is a subsequent cross-sectional view taken from FIG. 5 following a patterning and etching of a capacitor storage plate formed from porous silicon nanocrystal particles.

Referring now to FIG. 6, a patterned photoresist 62 is used to define a storage plate 61, comprising silicon nanocrystals and the underlying polysilicon 60 (if present).

Figure 7:
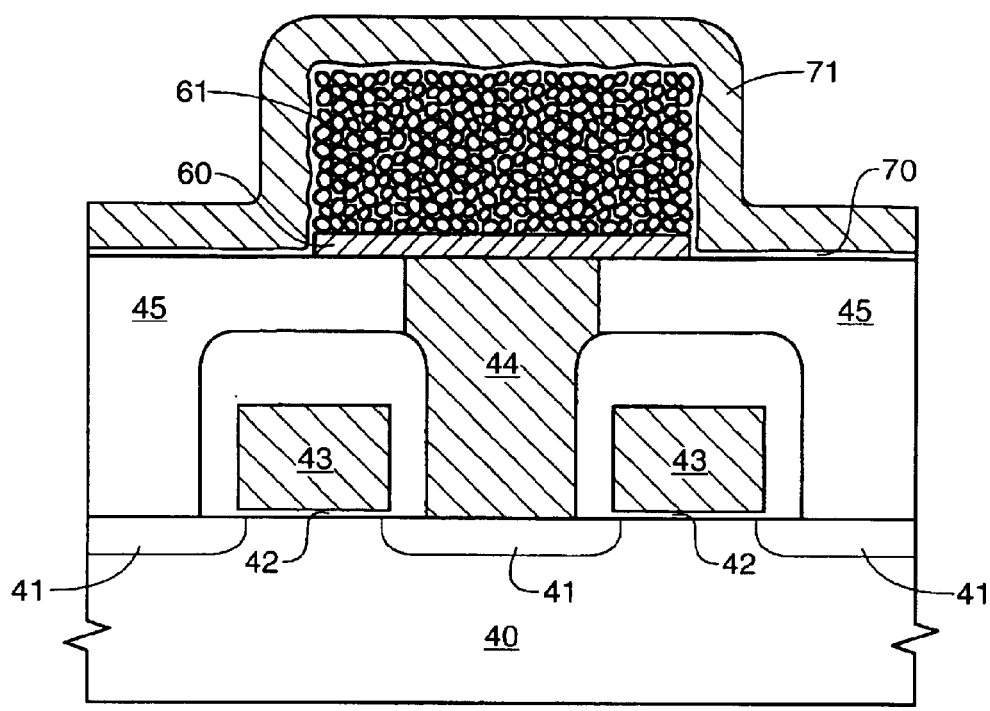
FIG. 7 is a subsequent cross-sectional view taken from FIG. 6 following the deposition of a capacitor cell dielectric and an overlying conductive layer.

Referring now to FIG. 7, a substantially conformal capacitor cell dielectric layer 70 is formed, preferably by ALD, over the capacitor storage plate 61 and conforms to a substantial number of the exposed silicon nanocrystals and over the top surface of adjoining planarized insulative material 45.

Figure 8:
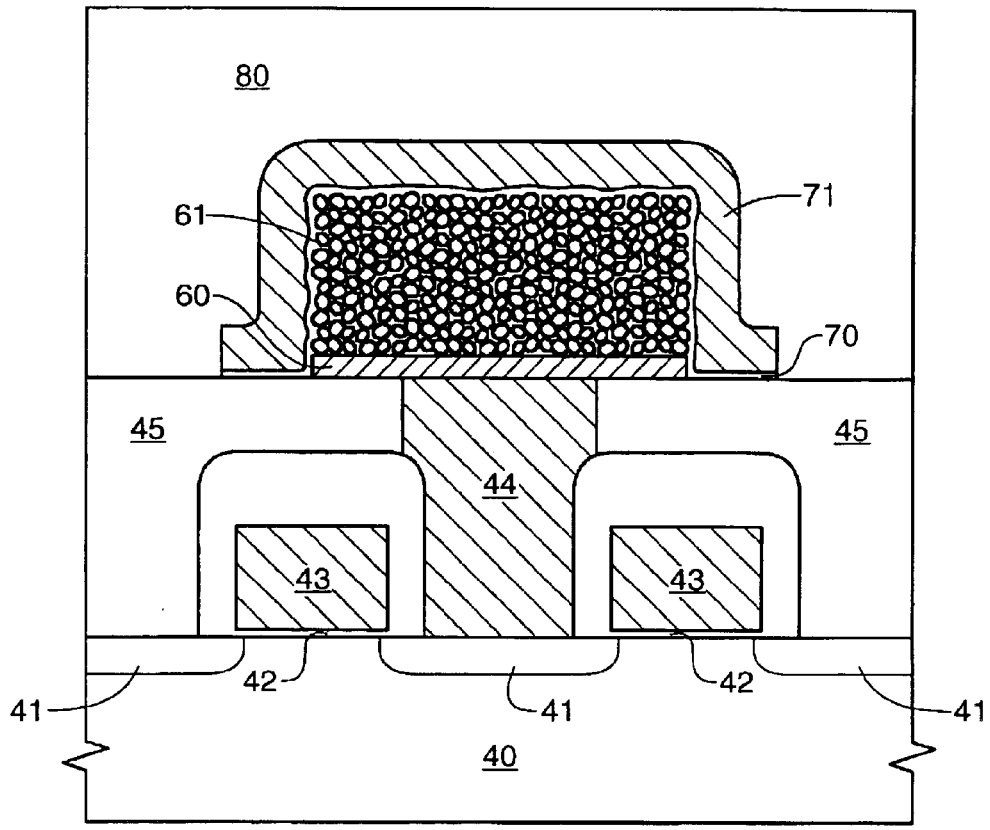
FIG. 8 is a subsequent cross-sectional view taken from FIG. 5 following a patterning and etching of a top capacitor plate and an overlying planarized insulative material.

Referring now to FIG. 8, a conductive layer, such as conductive polysilicon, is formed, preferably by ALD, and patterned to serve as a top capacitor plate 71, which overlies capacitor cell dielectric layer 70. Next, an insulative material, such as borophosphosilicate glass (BPSG) is formed over the final capacitor structure and planarized. Fabrication methods known to those skilled in the art are then used to complete the processing of the memory device.

In each exemplary embodiment, regardless of the amount of silicon nanocrystals formed, their formation comprises three steps. First, an aerosol of silicon nanocrystals is created. It is preferred that the aerosol contains spherical single crystal silicon particles with narrow size distributions and diameters down to less than 100 Angstroms. As reported in the referenced literature, an aerosol of silicon nanocrystals can be formed by pyrolysis of $SiH_4$ in a furnace at 900° C. The particle size distribution can be controlled through process parameters, such as the $SiH_4$ flow rate, possibly the inert gas flow rate and furnace temperature.

Second, after leaving the pyrolysis furnace, the aerosol of silicon nanocrystals travels to a deposition chamber where the silicon particles are deposited by thermophoresis onto a wafer substrate at approximately room temperature (approximately 23° C.) or greater. By this method, the silicon particles would successfully be deposited onto a wafer substrate that is at a temperature of approximately 23° C. up to 200° C.

Third, the wafer and silicon nanocrystal particles are subjected to sintering at a preferred temperature range of approximately 600° C. to 1400° C., which is below the melting point of silicon (approximately 1420° C.). Sintering within this preferred temperature range causes the silicon nanocrystals to adhere strongly to the substrate and to each neighboring silicon nanocrystal, thereby forming a substantially continuous (but porous) conductive layer.

As mentioned previously, prior to the administration of the aerosol, in the first exemplary embodiment an optional silicon liner may be formed on the sidewalls and bottom surface of opening 16 to provide for an adhesive membrane between the insulation material 15 and silicon nanocrystals 21. In the second exemplary embodiment, an optional silicon liner may be formed on the coplanar surfaces of insulative material 45 and conductive plug 44 to provide for an adhesive membrane between insulation material 45, the conductive plug 44 and silicon nanocrystals 51.

For each exemplary embodiment, it is advantageous to use dielectric and top electrode deposition processes that will allow the deposited film to cover as much of the nanocrystal surface (including any underlying nanocrystal surface) as possible in order to increase surface area for the capacitor. This may be achieved with conventional processes, such as oxidation (for the capacitor cell dielectric layer) and chemical vapor deposition of polysilicon (if used for the top capacitor plate).

The surface area of the capacitor will also be affected by the porosity of the nanocrystal layer, which is a function of the nanocrystal size and the sintering conditions. The tradeoff with increasing porosity is a decrease in the total surface area.

Presently, Atomic Layer Deposition (ALD), a process method know to one skilled in the art, is a preferred method for forming the capacitor cell dielectric layer and the top capacitor electrode, as this method provides the capability to more effectively conform to the porous (and thus irregular) surface of the nanocrystals. Though it is not necessary for the top capacitor electrode to cover the entire nanocrystal surface, it is desirable that a substantial portion (approaching 100%) be covered. Less than 100% coverage will result in less than the maximum attainable capacitance. However, it is important that the interposed capacitor cell dielectric layer completely cover the capacitor storage plate to ensure the top and storage plate electrodes do not short together.

In the exemplary embodiments of the present invention it is important that, prior to sintering, the silicon nanocrystals avoid oxidation during and after deposition that would isolate one nanocrystal from a neighboring one. If excessive oxidation were to occur the deposited nanocrystals could become insulated from each other and thus form a conductively discontinuous layer (thus electrically discontinuous during device operation), which is highly undesirable for a storage capacitor plate as a storage capacitor plate having a reduced effective surface area would result.

It is also important that as many nanocrystals as possible be physically connected to each neighboring nanocrystal to form a substantially continuous conductive, but porous, layer (thus being electrically continuous during device operation). This scenario would create a storage capacitor plate with an enhanced surface area, thus forming a capacitor possessing greater capacitance in a defined area than one formed by conventional fabrication techniques.

In each exemplary embodiment, the resulting capacitor structure comprises an open network of silicon nanocrystal particles with a porous surface area that thus promotes increased capacitance for the resulting storage cell. The completed capacitor structure and the fabrication method used therefor may be for various types of devices, such as embedded memory devices, and may be used in numerous semiconductor applications and particularly in, but not limited to, DRAM applications.

It is to be understood that, although the present invention has been described with reference to a preferred embodiment, various modifications, known to those skilled in the art, may be made to the disclosed structure and process herein without departing from the invention as recited in the several claims appended hereto.

What is claimed is:

1. A storage capacitor plate for a semiconductor assembly comprising:
    a substantially continuous porous conductive storage plate comprising silicon nanocrystals residing along coplanar surfaces of a conductive material and an insulative material adjacent said conductive material.

2. The storage capacitor plate claim 1, further comprising a polysilicon layer residing between said silicon nanocrystals and said surfaces of said conductive material and said insulative material.

3. The storage capacitor plate of claim 1, wherein said silicon nanocrystals comprise spherical single crystal silicon particles having narrow size distributions and diameters down to less than 100 Angstroms.

4. A storage capacitor plate for a semiconductor assembly comprising:
    a substantially continuous porous conductive storage plate comprising silicon nanocrystals residing along sidewall surfaces of an opening in a insulative material planarized and along a surface of a conductive material lying beneath said opening, said silicon nanocrystals contain conductive impurities.

5. The storage capacitor plate of claim 4, wherein said silicon nanocrystals substantially fill said opening.

6. The storage capacitor plate of claim 4, wherein said silicon nanocrystals comprise spherical single crystal silicon particles having narrow size distributions and diameters down to less than 100 Angstroms.

7. A storage cell for a semiconductor assembly comprising:
    a substantially continuous porous conductive storage plate comprising silicon nanocrystals residing along coplanar surfaces of a conductive material and an insulative material adjacent said conductive material;
    a conformal cell dielectric lying on exposed surfaces of said substantially continuous porous conductive storage plate;
    a conductive top cell plate.

8. The storage cell claim 7, further comprising a polysilicon layer residing between said silicon nanocrystals and said surfaces of said planarized conductive material and said planarized insulative material.

9. The storage cell of claim 7, wherein said silicon nanocrystals comprise spherical single crystal silicon particles having narrow size distributions and diameters down to less than 100 Angstroms.

10. A storage cell for a semiconductor assembly comprising:
    a substantially continuous porous conductive storage plate comprising silicon nanocrystals residing along sidewall surfaces of an opening in a insulative material planarized and along a surface of a conductive material lying beneath said opening, said silicon nanocrystals contain conductive impurities;
    a conformal cell dielectric lying on exposed surfaces of said substantially continuous porous conductive storage plate;
    a conductive top cell plate.

11. The storage cell of claim 10, wherein said silicon nanocrystals substantially fill said opening.

12. The storage cell of claim 10, wherein said silicon nanocrystals comprise spherical single crystal silicon particles having narrow size distributions and diameters down to less than 100 Angstroms.

* * * * *